United States Patent [19]
Wang et al.

[11] Patent Number: 5,703,912
[45] Date of Patent: Dec. 30, 1997

[54] CLOCK-RECOVERY DEVICE HAVING CASCADED RESONANCE AMPLIFIERS

[75] Inventors: Zhigong Wang, Umkirch; Manfred Berroth, Neuenburg, both of Germany

[73] Assignee: Fraunhofer-Gesellschaft Zur Forderung der Angewandten Forschung e.V., Germany

[21] Appl. No.: 646,236

[22] PCT Filed: Sep. 8, 1994

[86] PCT No.: PCT/DE94/01044

§ 371 Date: May 13, 1996

§ 102(e) Date: May 13, 1996

[87] PCT Pub. No.: WO95/14339

PCT Pub. Date: May 26, 1995

[30] Foreign Application Priority Data

Nov. 13, 1993 [DE] Germany ............ 43 38 873.6

[51] Int. Cl.$^6$ .................................. H04L 7/00
[52] U.S. Cl. ............ 375/354; 330/253; 330/277; 330/307; 330/310; 327/141
[58] Field of Search .................. 375/354, 371, 375/376, 326, 327; 330/253, 257, 262, 264, 269, 277, 307, 310; 327/141

[56] References Cited

U.S. PATENT DOCUMENTS 5,089,789  2/1992  Van Tran .

FOREIGN PATENT DOCUMENTS 0 228 941  7/1987  European Pat. Off. .
58-003307  1/1983  Japan .
63-204851  8/1988  Japan .
63-228816  9/1988  Japan .

OTHER PUBLICATIONS

Wang, "MultiGbits/s data regeneration and clock recovery IC design", Annales des telecommunications, Tome 48, No. 3–4, pp. 132–147, Apr. 1993.

Wang et al, "New Proposal for a Multigigabit/s Clock Recovery IC Based on a Standard Silicon Bipolar Technology", Electronic Letters, vol. 23, No. 9, pp. 454–455, Apr. 23, 1987.

Wang, "Monolithisch–Integrierte Silizium–Bipolar–Schaltungen Zur Taktruckgewinnung Bei Datenraten Von Mehreren Gbit/s", Dissertation, pp. 66–69 and 92–93, 1990.

Primary Examiner—Stephen Chin
Assistant Examiner—Hai H. Phan
Attorney, Agent, or Firm—Baker & Daniels

[57] ABSTRACT

A circuit for clock recovery from an input signal, particularly an alternating input signal formed from a data signal, the invention calling for a filter/amplifier unit made up of several series-connected resonance ampliers to be formed in a regenerative frequency filter. Unlike series-connected resonance amplifiers without feedback, the filter/amplifier unit has an overall Q-factor in the feedback loop which increases essentially linearly with the number of resonance amplifiers and their Q-factor. This enables the required high overall Q-factor to be obtained for the clock-recovery circuit with a relatively low number of resonance amplifiers with a Q-factor which is low compared with the overall Q-factor. A slope detector, a frequency mixer and the resonance amplifiers have similar assemblies so that the circuit can be designed more simply as a solid-state integrated circuit.

13 Claims, 4 Drawing Sheets

FIG._1

FIG_2

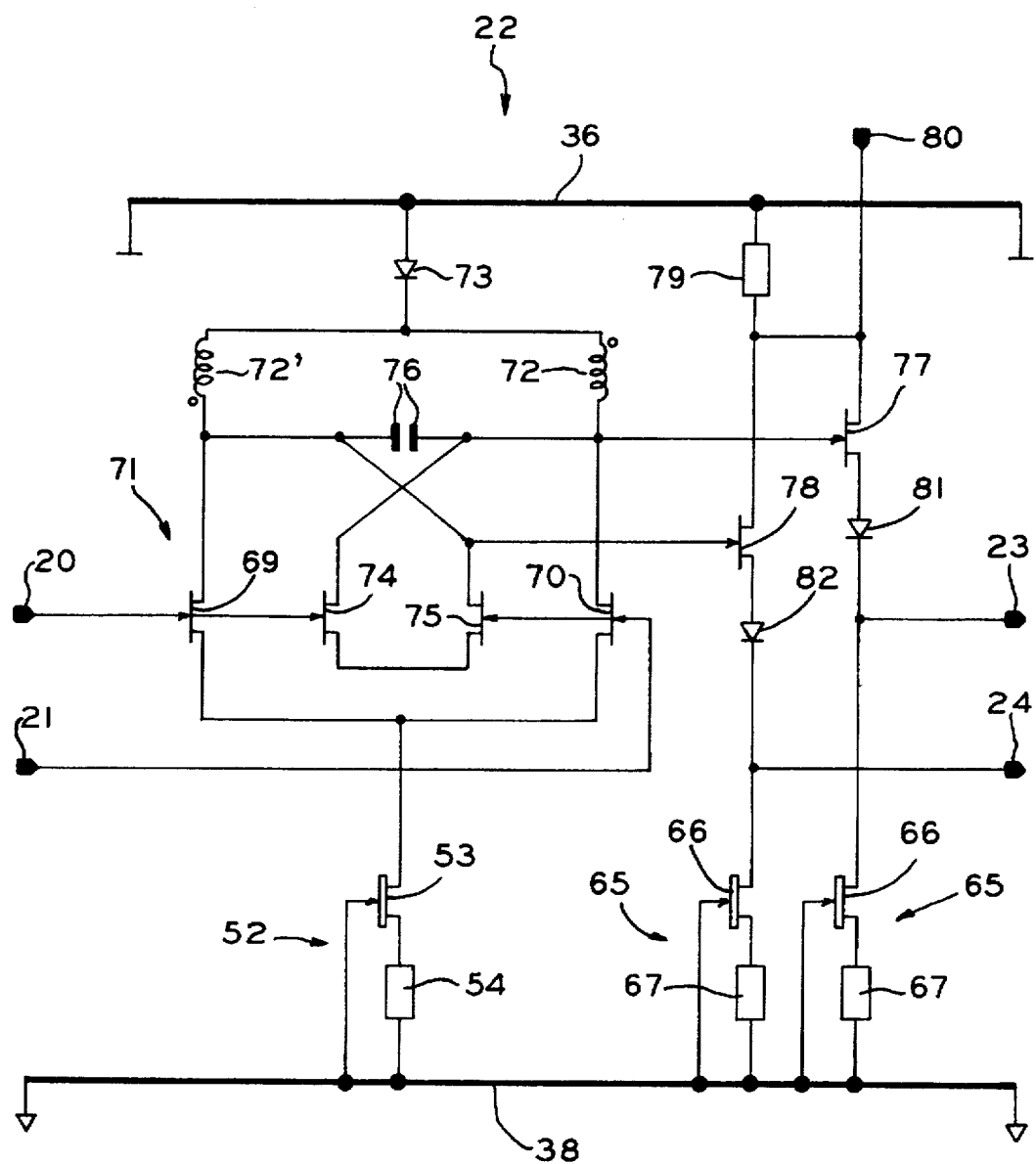
FIG_4

CLOCK-RECOVERY DEVICE HAVING CASCADED RESONANCE AMPLIFIERS

BACKGROUND OF THE INVENTION

The invention relates to a device for clock recovery from an input signal carrying alternating voltage and formed notably of a digital data signal, comprised of a frequency mixer to which on a first input a signal assigned the clock frequency of the alternating voltage-carrying input signal is fed, of a filter and an amplifier for amplification of a narrow-band frequency range of the output signal of the frequency mixer, with the filter and amplifier unit composed of the filter and amplifier possessing a high overall integrity, and of a feedback line for feeding the output signal of the amplifier to a second input of the frequency mixer.

Such a device is known from the article "MultiGbits/s Data Regeneration and Clock Recovery IC Design" by Zhigong Wang in the publication *Annales des Télécommunications*, volume 48, No. 3–4, which appeared in 1993, pages 132 through 147. This device features a flank detector with a monolithically integrated exclusive-or circuit XOR, with which the flanks of the alternating-voltage-carrying input signal allow detection via an exclusive-or comparison of two signal portions that are phase-shifted relative to each other and formed of the alternating-voltage-carrying input signal. The filter and amplifier function is carried out separately using an external falter with an integrity rating of about 600 and a monolithically integrated amplifier, the filter preferably fashioned as an acoustic surface wave filter.

The device features a limiter circuit for level adjustment of the output clock signal to a maximum value, said device following the amplifier. The output signal of the limiter circuit is fed to the second input of the frequency mixer via the feedback line. This device allows the regeneration of a clock signal from data signals at a data rate of about 3 gigabits per second. To raise the maximum feedable data transfer rate to 4.5 gigabits per second, three amplifiers succeed the filter in a modified configuration of this device.

In a second embodiment of the above device for clock recovery, the surface wave filter is replaced by a dielectric resonator filter, which is employed at a higher clock frequency, of about 10 gigahertz, so that the operating frequency can be increased as compared to a device incorporating a surface wave filter.

Although the above clock recovery devices have the advantage that the maximum feedable data rate can be doubled by tuning the center frequency of the filter to one-half the clock frequency of the data signal, the design of the filter as an external component of high integrity gives rise to three problems at data rates above 10 gigabits per second.

The first problem is that the surface wave filter and the dielectric resonator filter for a clock frequency above 5 gigahertz and an integrity rating of several hundred can be produced with the present state of the art only at a very high manufacturing expense. The second problem is that the asymmetric structure and the low-ohm inputs and outputs of both falter types prevent the realization of a stable overall circuit with a very high operating frequency. The third problem is that the hybrid structure of the overall circuit entails for a mass product a very high manufacturing expense with correspondingly high unit cost.

Known from the published article "New Proposal for a Multi-Gigabit/s Clock Recovery IC Based on a Standard Silicon Bipolar Technology," by Z. Wang and U. Langmann, in *Electronics Letters* 23 (1987) No. 9, pages 454, 455, is a clock recovery device where an external surface wave filter is provided in a feedback circuit between two band-pass amplifiers of monolithically integrated structure. The extracted frequency corresponds to one-half the clock frequency of the input signal fed to a frequency mixer. The overall integrity of a filter and amplifier unit formed of the two band-pass amplifiers and the interposed external filter is substantially determined by the relatively high integrity of the surface wave filter, since the band-pass amplifiers have an integrity entirely insufficient for filtering purposes, typically with a rating of two.

Known from the dissertation submitted by Z. Wang in 1990 for a doctorate of the Electronics Department at the Ruhr University of Bochum, rifled "Monolithically Integrated Silicon Bipolar Circuits for Clock Recovery at Data Rates of Several GBit/S," is that a filter and amplifier unit with a single external filter in a feedback circuit similar to the aforementioned published article, has in comparison with the integrity of the individual filter an overall integrity that is higher by a factor of four. But, also in this clock recovery device, the integrity of the individual external filter, with a rating of about 200, is for manufacturing reasons still unfavorably high for achieving an overall integrity rating of 800.

The objective underlying the invention is to provide a device of the initially named type which also at high and highest clock frequencies of the alternating-voltage-carrying input signal features a filter and amplifier unit which technologically is relatively simple to manufacture and allows easy adaptation to different integrity requirements.

SUMMARY OF THE INVENTION

This objective is accomplished according to the invention by providing at least two series-wired resonance amplifiers that form the filter and amplifier unit and comprise tank circuits with inductances of monolithically integrated design, the resonance amplifiers possessing an integrity low as compared to the overall integrity of the filter and amplifier unit, so that the filter and amplifier unit of high overall integrity, formed of the cascaded resonance amplifiers, is suited for amplification of a narrow-band frequency range of the output signal of the frequency mixer.

According to the invention, the filter and amplifier unit of high integrity is formed of several resonance amplifiers wired in series, with each resonance amplifier features inductances structured. These inductances of monolithically structured configuration lead, as compared to the overall integrity of the filter and amplifier unit, e.g., to an integrity of an individual resonance amplifier that is lower by one order of magnitude. The inventional cascading of the resonance amplifiers in a feedback circuit results in an essentially linear increase of the overall integrity of the filter and amplifier unit with the number of resonance amplifiers, where as a function of the phase shift of the output signal of the last resonance amplifier fed back to the frequency mixer a high overall integrity is achievable, as regards the input signal being examined, already with few resonance amplifiers which in terms of manufacturing allow easy integrated fabrication. The overall integrity depends as well on the integrity and number of the individual resonance amplifiers, so that an easy overall integrity adjustment is accomplished.

In a favorable development, providing a safety circuit for load separation achieves a low-disturbance cascading of the resonance amplifiers.

In a further suitable embodiment of the invention, a resonance amplifier features a differential amplifier with two field-effect transistors whose drains connect each via a coil, as inductance, and at least one diode to a circuit means whose gates connect to inputs of the resonance amplifier and whose sources are hooked, via a constant-current source, to a negative supply voltage. By providing differential amplifiers with field-effect transistors whose capacities form together with the coils a tank circuit of low integrity, a balanced output signal is being achieved.

Configuring the safety circuit with output field-effect transistors and diodes, for one, suppresses feedbacks. For another, applying on the drains of the output field-effect transistors a tuning voltage renders the effective capacities in a tank circuit variable, making the resonance frequency and, with fine tuning, the phase shift adjustable.

Providing compensating field-effect transistors and a capacitor boosts the integrity of the output signal by opposite-phase coupling of parasitic capacities of the differential amplifiers.

Phase-shifting the output signal of the last resonance amplifier in the direction of signal travel in relation to the signal present on the first inputs of the frequency mixer guarantees, with the number of resonance amplifiers, a relatively large proportionality factor in boosting the overall integrity of the filter and amplifier unit.

BRIEF DESCRIPTION OF THE DRAWINGS

Further advantages and embodiments of the invention derive from the subclaims and the following description of embodiments with reference to the drawing figures, which show:

FIG. 4, a wiring diagram of a filter and amplifier element configured as a resonance amplifier.

DESCRIPTION OF THE PREFERRED EMBODIMENT

Figure 1:
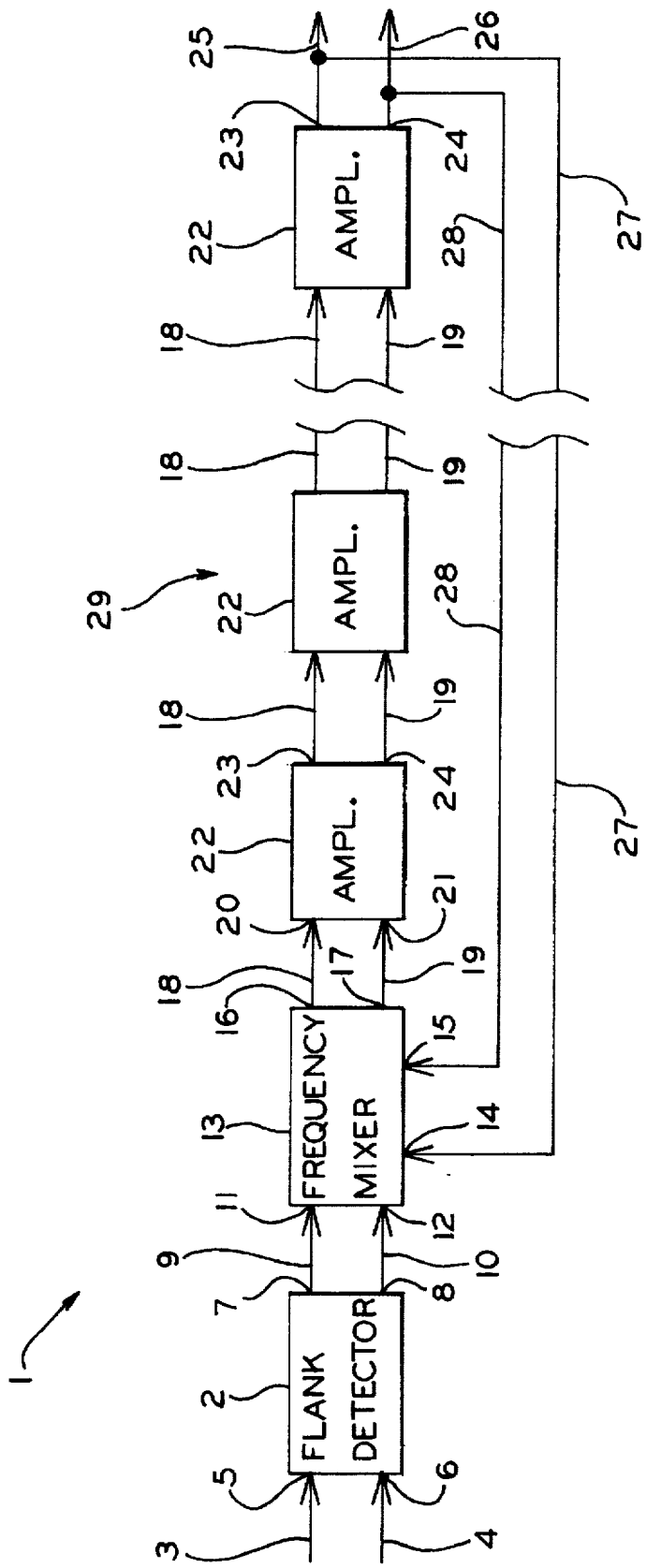
FIG. 1, a block diagram of a device for clock recovery.

FIG. 1 shows in a block diagram a clock recovery device 1; said device 1 features a flank detector 2 to which as an alternating-voltage-carrying input signal a digital data signal is fed via two data lines 3, 4 and two inputs 5, 6. The digital data signal traveling down the data lines 3, 4 has in the present exemplary embodiment a so-called non-return-to-zero NRZ format, in which the high level of a logic one within a clock period does not return to the zero level. Thus, a sequence of logic one signals presents itself as a continuous, high level over the respective number of clock periods. The output signal of the flank detector 2 assigned the clock frequency of the data signal is fed, via outputs 7,8, lines 9, 10 and first inputs 11, 12, to a frequency mixer 13.

The signal present on the first inputs 11, 12 of frequency mixer 13 can be mixed with a clock signal prevailing on second inputs 14, 15 of the frequency mixer 13, by multiplication of the two input signals. Prevailing on outputs 16, 17, the output signal of the frequency mixer 13 is fed to a resonance amplifier 22 via clock lines 18, 19 and inputs 20, 21. The clock signal present on the clock lines 18, 19 is amplifiable with the resonance amplifier 22 in a frequency range predetermined by the center frequency and integrity of the resonance amplifier 22.

Filtered and amplified as compared to the signal present on inputs 20, 21, the output signal of the resonance amplifier 22 is tapped on outputs 23, 24 and fed, via further clock lines 18, 19, to a second resonance amplifier 22, whose output signal is transmitted to further resonance amplifiers 22, of which FIG. 1 shows merely the last amplifier 22 in the direction of signal travel. Present on outputs 23, 24, of the last resonance amplifier 22 and output clock lines 25, 26 is the amplified and filtered output clock signal regenerated from the data signal. The output clock signal is fed back to the frequency mixer 13 via feedback lines 27, 28 connected to the output clock lines 25, 26 and via the second inputs 14, 15. When in series, the resonance amplifiers 22 form a filter and amplifier unit 29.

As explained farther down, the resonance amplifiers 22 can be tuned to a center frequency. In one exemplary embodiment of a clock recovery device 1, the center frequency of the resonance amplifier 22 is tuned to one-half the clock frequency of the NRZ-format data signal carried on data lines 3, 4. Due to the multiplicative mixing of the input signals of frequency mixer 13, the signal on clock lines 18, 19 has a frequency corresponding to one-half the clock frequency of the data signal. Thus, by halving the regenerated clock frequency, data signals can be processed at high data rates.

For instance, when processing a dam signal generated by multiplexing with superimposition of data signal portions of different frequencies involves the recovery of the low frequencies of the clock signal, the resonance amplifiers 22 have the fraction of an integer multiple of the factor 2 of the highest clock frequency as center frequency. When an output clock signal with the same frequency as the highest clock frequency of the data signal is required, the resonance amplifiers 22 are tuned to the clock frequency of the data signal. The flank detector 2 is in this case tuned to the second harmonic of the clock frequency of the data signal. This is favorable notably whenever the bit rate of the data signal is relatively low.

For a data signal with a so-called return-to-zero RZ format, where the high level of a logic one returns within a clock period to the lower value, the clock recovery device 1 can be operated in two modes. In the first mode, the data signal is fed to the frequency mixer 13 directly via inputs 11, 12, with the clock frequency of the data signal corresponding to twice the operating frequency of the resonance amplifier 22. In this exemplary embodiment, the signal coordinated with the clock frequency is the data signal itself.

In the second mode of operation, the data signal with the RZ format is fed to a flank detector 2, with the clock frequency of the data signal corresponding to the operating frequency of the resonance amplifier 22. The flank detector 2 acts in this mode of operation as a frequency doubler, since it detects and transmits to the frequency mixer 13 always two flanks per data bit.

Cascading several resonance amplifiers 22 in the circuit formed by the frequency mixer 13, the filter and amplifier unit 29 composed of the resonance amplifiers 22, and of the feedback lines 27, 28 results in a substantially linear increase of the overall integrity of the filter and amplifier unit 29 with an increasing number of resonance amplifiers 22, while in a serial circuit of tuning elements without feedback the increase of overall integrity diminishes from one tuning element to the next continuously, so that achieving a high overall integrity of the serial circuit would require a number of tuning elements unsuitably high for practical applications.

In the filter and amplifier unit 29 illustrated in FIG. 1, the resonance amplifiers 22—as will be explained in detail farther down—are of a monolithically integrated structure and have an integrity rating of about 20. If the output clock signal on the output clock lines 25, 26 is time-delayed only very little as compared to the signal carried on lines 9, 10, the proportionality factor of the increase in overall integrity amounts to about 1.7 with an increasing number of resonance amplifiers 22. Achieved thereby with about ten resonance amplifiers 22, each having an integrity rating of about 20, is already an overall integrity of the filter and amplifier unit 29 that rates at about 340, sufficient for many applications of the clock recovery device 1.

With a clock frequency of the data signal so high that—as compared to the clock period of the data signal—a large time delay occurs between the input signal of a resonance amplifier 22 and its output signal, the proportionality factor increases further. With a time delay corresponding to one-fourth of the clock period of the data signal it amounts to about 3.0, with a time delay by one-half the clock period of the data signal to 4.2, and with a time delay by a full clock period to about 6.8. In the latter case, using five resonance amplifiers 22 achieves for the filter and amplifier unit 29 already an overall integrity rating of 700, which for the usual applications is entirely sufficient.

The following part of the specification uses for the expression "field-effect transistor" the customary abbreviation "FET" as well as the customary definitions "gate," "drain" and "source" in conjunction with the field-effect transistor connections.

Figure 2:
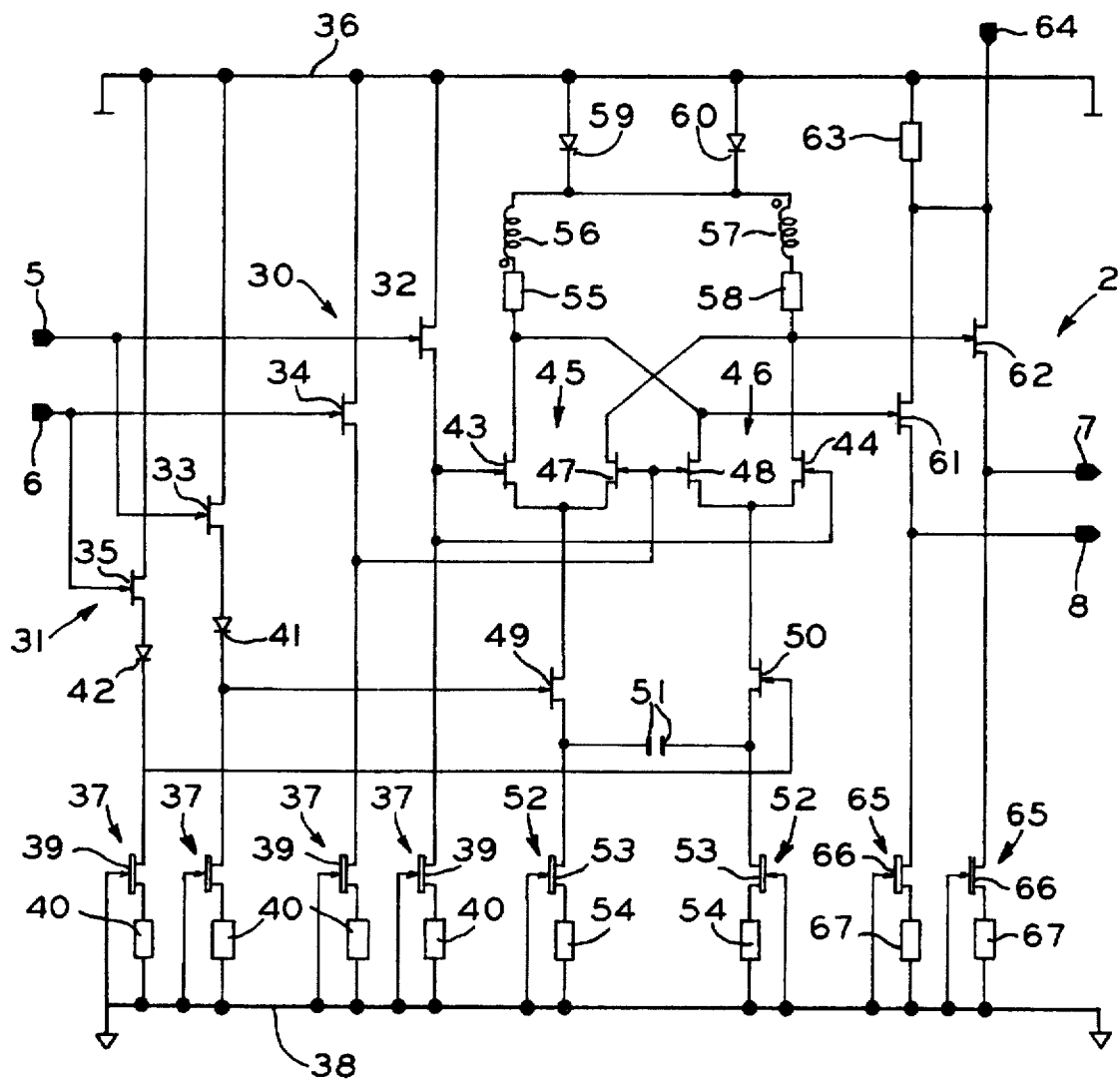
FIG. 2, a wiring diagram of a flank detector

FIG. 2 shows in a wiring diagram an exemplary embodiment of a flank detector 2 having a monolithically integrated structure. The data signal present on the inputs 5, 6, is fed to a first input stage 30 and a second input stage 31. The signal present on input 5 is fed to the gate of a first input FET 32 of the first input stage 30 and to a first input FET 33 of the second input stage 31. The signal present on input 6 is fed to a second input FET 34 of the first input stage 30 and to a second input FET 35 of the second input stage 31. The gate widths of the FETs 32, 33, 34, 35 mount to 10 μm, the gate lengths to 0.3 μm.

The drains of inputs FETs 32, 33, 34, 35 are connected to a circuit means line 36. The sources of input FETs 32, 34 connect via constant-current sources 37 to a supply voltage line 38. The sources of input FETs 33, 35 connect each via a level diode 41, 42 to one each constant-current source 37. The supply voltage line 38 carries a negative supply voltage.

The constant-current sources 37 feature each a self-conducting FET 39, whose drain connects on the circuit means side to further components, whose gate is connected to the supply voltage line 38, and whose source connects via a negative feedback resistor 40 for current stabilization as well to the supply voltage line 38. In the present exemplary embodiment, the negative feedback resistors 40 have a rating of about 100 Ω. The gate widths of FETs 39 mount to 10 μm, the gate lengths to 0.3 μm.

The gates of a first differential FET 43, 44 each of a first differential amplifier 45 and a second differential amplifier 46 are connected to the source side output line of the first input FET 32 of the first input stage 30. The gates of the second FETs 47, 48 of the first differential amplifier 45 and second differential amplifier 46 are connected to the source side output line of the second input FET 34 of the first input stage 30.

The sources of the first differential FET 43 and second differential FET 47 of the first differential amplifier 45 are wired together and hooked to the drain of a first control FET 49. The gate of the first control FET 49 is placed between level diode 41 and FET 39 of the constant-current source 37 that is connected to level diode 41. The sources of the first differential FET 44 and second differential FET 48 of the second differential amplifier 46 are as well combined and hooked to the drain of a second control FET 50. The gate of the second control FET 50 is wired between level diode 42 and the, hooked to it, drain of FET 39 of the pertaining constant-current source 37.

The sources of the first control FET 49 and second control FET 50 are bridged via a coupling capacitor 51 and hooked, each via a constant-current source 52 with a self-conducting FET 53 wired similar to the constant-current sources 37, and with a negative feedback resistor 54, to the supply voltage line 38. The negative feedback resistors 54 of the constant-current sources 52 have a rating of about 200 Ω. The gate lengths of the self-conducting FETs 53 of constant-current sources 52 have a value of 0.3 μm, the gate widths of about 5 μm.

The drain of the first differential FET 43 of the first differential amplifier 45 connects via first tank circuit resistor 55, a first oscillator coil 56, a second oscillator coil 57 and a second tank circuit resistor 58 to the drain of the first differential FET 44 of the second differential amplifier 46. The combined ends of the oscillator coils 56, 57 are hooked to the circuit means line 36 via two level diodes 59, 60 wired in forward direction. The tank circuit resistors 55, 58 are rated about 100 Ω. The oscillator coils 56, 57 have an inductance of about 250 picohenries.

The drain of the first differential FET 43 of the first differential amplifier 45 is hooked to the second drain of the second differential FET 48 of the second differential amplifier 46. The drain of the first differential FET 44 of the second differential amplifier 46 is hooked to the drain of the second differential FET 47 of first differential amplifier 45.

The combined drains of the differential FETs 43, 48 are wired to the gate of a first output FET 61. The combined drains of the differential FETs 44, 47 are wired to the gates of a second output FET 62. The gate widths of output FETs 61, 62 amount to 50 μm and the gate lengths to 0.3 μm. The drains of output FETs 61, 62 are via a ballast resistor 63 of about 100 Ω hooked to the supply voltage line 38 and can receive, via a tuning voltage connection 64, a tuning voltage for center frequency adjustment of the resonance circuit to the clock frequency of the data signal.

The sources of output FETs 61, 62 are hooked each to the supply voltage line 38, via constant-current sources 65, each with a self-conducting FET 66 and a negative feedback resistor 67, using the same manner of wiring as with the constant-current sources 37, 52. The negative feedback resistors 67 of the constant-current sources 65 rate about 67 Ω. The self-conducting FETs 66 have a gate width of 15 μm and a gate length of 0.3 μm. The sources of output FETs 61, 62 are hooked to the outputs 7, 8.

The flank detector 2 described above is a modified exclusive-or circuit suited for exciting to oscillation the circuit tuned to the clock frequency of the data signal present on inputs 5, 6, and which circuit is formed by oscillator coils 56, 57 and the capacities of FETs 43, 44, 47, 48, 61 and 62, at a level 0-1 transition by activation of the differential FET 43 and control Flit 49, and at a level 1-0 transition by activation of the differential FET 48 and control FET 50. Consequently, outputs 7, 8 carry a signal with a frequency matching the clock frequency of the data signal present on inputs 5, 6. Due to providing two differential amplifiers 45, 46, the output signal of flank detector 2 has a double-balanced characteristic. By coupling the differential amplifiers 45, 46, activated by control FETs 49, 50, via the coupling capacitor 51, allows separating a DC current portion in the data signal.

Figure 3:
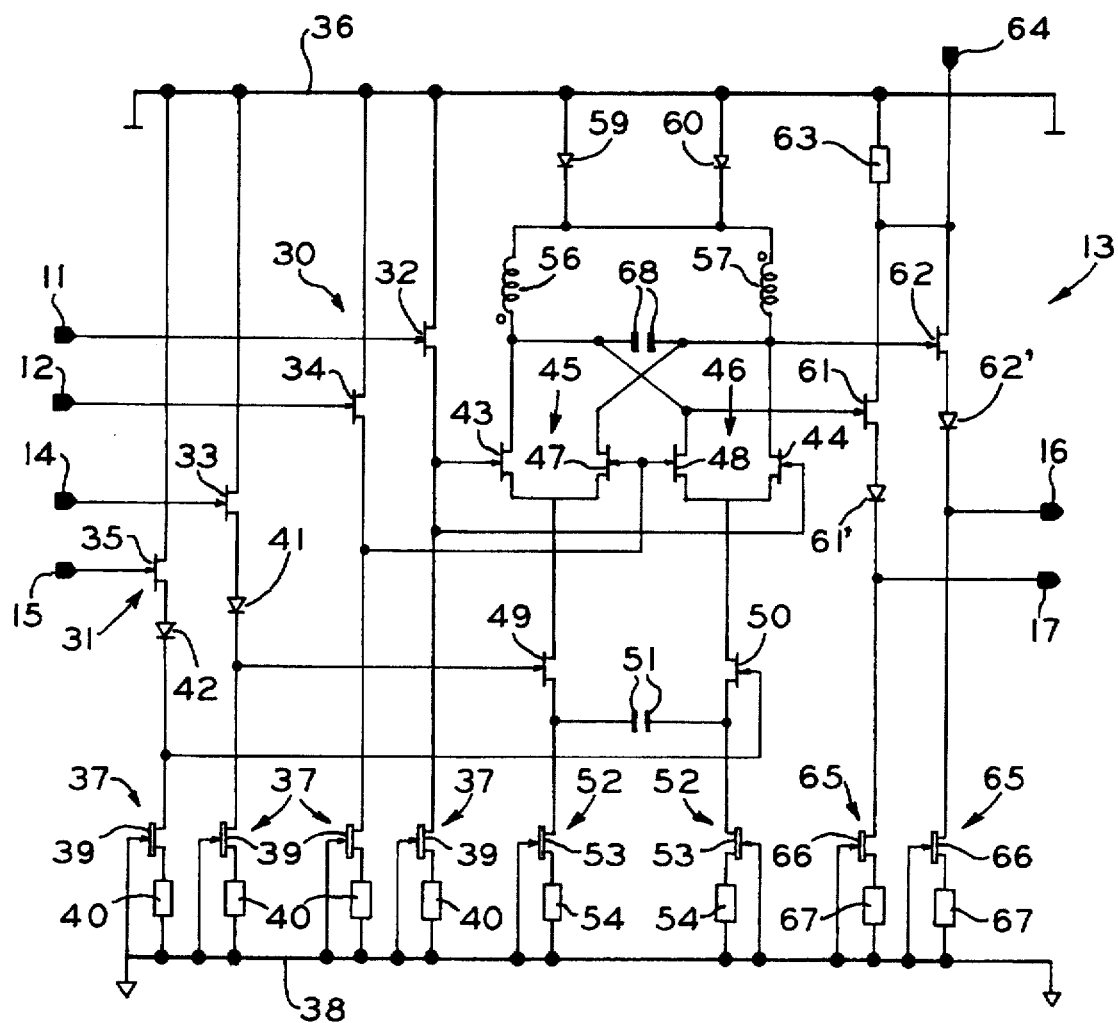
FIG. 3, a wiring diagram of a frequency mixer.

FIG. 3 shows the wiring diagram of an exemplary embodiment of the frequency mixer 13 with a monolithically integrated structure. The first inputs 11, 12 carry the output signal of the flank detector 2. The second inputs 14, 15 carry the output signal of the last resonance amplifier 22 of the filter and amplifier unit 29. The structure of the frequency mixer 13 corresponds largely with that of the flank detector 2, with FIG. 3 using identical references for components of the frequency mixer 13 matching the components of flank detector 2.

Input 11 connects to the gate of the first input FET 32 of the first input stage 30. Input 12 connects to the gate of the second input FET 34 of the first input stage 30. Input 14 connects to the gate of the first input FET 33 of the second input stage 31, while input 15 connects to the gate of the second input FET 35 of the second input stage 31. The drains of the second differential FETs 47, 48 of differential amplifiers 45, 46 are bridged using a tank circuit capacitor 68 of about 20 femtofarads. The oscillator coils 57, 58 of the frequency mixer 13 have an inductance of about 550 picohenries.

In the present exemplary embodiment, the clock frequency of the data signal ranges at a value which for tuning the resonant circuit of the frequency mixer 13 requires a tank circuit capacitor 68, which latter, however, is at the corresponding position in the flank detector 2 not required, because its operating frequency is twice as high. With a clock frequency distinctly elevated as compared to this clock frequency, the tank circuit capacitor 68 is not needed in the frequency mixer 13, whereas with a distinctly reduced clock frequency it is provided in the flank detector 2 as well, between the combined drains of the differential FETs 43, 48 and differential FETs 44, 47.

In the frequency mixer 13, the differential amplifiers 45, 46 and the control FETs 49, 50 connected to them can be activated, independently of each other, via the first inputs 11, 12 and second inputs 14, 15. In one operating mode of the clock recovery device 1, the signal prevailing on the first inputs 11, 12 has twice the frequency of the clock signal present on the second inputs 14, 15, with the tank circuit formed by oscillator coils 56, 57 and the capacities of FETs 43, 44, 47, 48, 61, 62 tuned to the frequency fed to the second inputs 14, 15. The output signal of the frequency mixer 13 on the outputs 16, 17 has thus the frequency of the signal carried on the second inputs 14, 15.

The frequency mixer 13 features for level shifting and suppression of feedback from the succeeding resonance amplifiers 22 on its output end protective diodes 61, 62 wired in forward direction between the sources of output FETs 61, 62 and the taps of outputs 16, 17.

The output signal of the frequency mixer 13 is fed to the resonance amplifier 22 of monolithically integrated design, depicted in the wiring diagram relative to FIG. 4, via inputs 20, 21. Connected to input 20 is the gate of a first differential FET 69 while a gate of a second differential FET 70 of a differential amplifier 71 connects to input 21, the differential FETs 69, 70 being fabricated each with a gate width of 10 µm and a gate length of 0.3 µm.

The sources of differential FETs 69, 70 are combined and hooked to the supply voltage line 38 via a constant-current source 52. The drains of differential FETs 69, 70 are connected each to the leads of two oscillator coils 72', 72. The leads of oscillator coils 72', 72 are combined and connected to circuit means line 36 via a level diode 73 wired in forward direction.

The resonance amplifier 22 features for opposite-phase coupling of parasitic capacities of the differential amplifier 71 two compensating FETs 74, 75 with gate widths of 10 µm and gate lengths of 0.3 µm. Their sources are connected to one another, and their gates are hooked each to an input 20, 21; the drain of the compensating FET 74 connected to input 20 is connected to the drain of the second differential FET 70, the drain of the compensating Flit 75 connected to input 21 is hooked to the drain of the first differential FET 69. The drains of FETs 69, 75 are bridged via a tank circuit capacitor 76 of about 20 femtofarads capacity rating with the combined drains of FETs 70, 74.

The combined drains of the second differential FET 70 and of the compensating FET 74 as well as the combined drains of the first differential FET 69 and of the compensating FET 75 are wired to the gates of two output FETs 77, 78 with gate widths of 50 µm and gate lengths of 0.3 µm, with the drains of output FETs 77, 78 connecting, for one, via a ballast resistor 79 rated about 100 Ω to the circuit means line 36 and, for another, receiving a tuning voltage via a tuning lead 80. The tuning voltage allows tuning the resonance frequency of the tank circuit formed by the oscillator coils 72', 72 and the capacities connected to them.

The sources of output FETs 77, 78 connect for level shifting and suppression of feedbacks from succeeding resonance amplifiers 22 as well as constant-current sources 65, via protective diodes 81, 82 wired in forward direction, to the supply voltage line 38. Outputs 23, 24 connect on the drain side to the constant-current sources 65.

The phase adaptation between the signals present on the first inputs 11, 12 and second inputs 14, 15, to a phase angle of favorably about 90° or 270°, is effected via phase shift by the frequency mixer 13, the resonance amplifiers 22 as well as the length of the feedback lines 27, 28, with the fine tuning taking place by way of adjusting the tuning voltage that prevails on the tuning leads 64, 80.

The resonance amplifier 22 has an integrity rating of about 20. As illustrated in FIG. 1, the resonance amplifiers 22 wired in series form a filter and amplifier unit 29 whose overall integrity increases substantially proportionally with the number and integrity of the individual resonance amplifiers 22. Owing to the relatively simple wig structure and the associated technologically nonproblematic monolithic integrateability of the resonance amplifier 22, an integrity rating of about 500, sufficient for clock recovery, is thus achievable with a relatively small number.

As follows from the wiring diagrams relative to FIG. 2, 3 and 4, the flank detector 2 and the frequency mixer 13 have in these exemplary embodiments a very similar circuitry structure. Also the modules of the resonance amplifier 22, except for a modified line routing, are very similar to the corresponding modules of the frequency mixer 13. Therefore, the manufacturing methods for the flank detector 2, the frequency mixer 13 and the resonance amplifier 22 are easily reproducible, thus keeping the manufacturing costs low.

| List of References | | | |
|---|---|---|---|
| 1 | Clock recovery device | 45 | First differential amplifier |
| 2 | Flank detector | 46–48 | Second differential amplifier |
| 3–4 | Data line | 49 | Control FET |
| 5–6 | Input | 50 | Second control FET |
| 7–8 | Output | 51 | Coupling capacitor |
| 9, 10 | Line | 52 | Constant-current source |
| 11, 12 | First input | 53 | Self-conducting FET |
| 13 | Frequency mixer | 54 | Negative feedback resistor |

-continued

| List of References | | | |
|---|---|---|---|
| 14–15 | Second input | 55 | Tank circuit resistor, first |
| 16–17 | Output | 56, 57 | Oscillator coil |
| 18–19 | Clock lines | 58 | Tank circuit resistor, second |
| 20–21 | Input | 59, 60 | Level diode |
| 22 | Resonance amplifier | 61, 62 | Output FET |
| 23–24 | Output | 63 | Ballast resistor |
| 25–26 | Output clock lines | 64 | Tuning voltage connection |
| 27, 28 | Feedback lines | 65 | Constant-current source |
| 29 | Filter and amplifier unit | 66 | Self-conducting FET |
| | | 67 | Negative feedback resistor |
| 30, 31 | Input stage | 68 | Tank circuit capacitor |
| 32 | First input FET | 69, 70 | Differential FET, first |
| 33 | First input FET | 71 | Differential amplifier |
| 34, 35 | Second input FET | 72 | Oscillator coil |
| 36 | Circuit means line | 73 | Level diode |
| 37 | Constant-current source | 74, 75 | Compensating FET |
| 38 | Supply voltage line | 76 | Tank circuit capacitor |
| 39 | Self-conducting FET | 77, 78 | Output FET |
| 40 | Negative feedback resistor | 79 | Ballast resistor |
| 41, 42 | Level diode | 80 | Tuning lead |
| 43, 44 | Differential FET | 81, 82 | Protective diode |

We claim:

1. An apparatus for clock recovery from an alternating-voltage-carrying input signal which is formed from a digital data signal, said apparatus comprising a frequency mixer, said frequency mixer having first and second inputs and first and second outputs, said first input supplied with a signal that is assigned the clock frequency of an alternating-voltage-carrying input signal, and a filter and amplifier means for amplifying a narrow-band frequency range of an output signal of said frequency mixer, said filter and amplifier means including a filter and amplifier element having a high overall integrity, a feedback line transmitting an output signal of said filter and amplifier means to said second input of said frequency mixer, said filter and amplifier means including at least two series-wired filter and amplifier elements which comprise resonance amplifiers having tank circuits with inductances of monolithically integrated design, said resonance amplifiers having a low integrity as compared to the overall integrity of said filter and amplifier means, whereby the filter and amplifier means has high overall integrity and is formed of the cascaded resonance amplifiers, and is suited for amplification of a narrow-band frequency range of the output signal of the frequency mixer.

2. The apparatus according to claim 1, wherein each said resonance amplifier includes one differential amplifier with two field-effect transistors whose drains are interconnected via an inductance configured as a coil and which are connected by a diode to a circuit line, whose gates are connected to inputs of the resonance amplifier and whose sources are connected to a negative supply voltage via a constant-current source.

3. The apparatus according to claim 2, wherein the field-effect transistors are connected to a safety circuit having two output field-effect transistors and two diodes, with the drains of the field-effect transistors each connected to the gate of an output field-effect transistor, the drains of the output field-effect transistors receiving a timing voltage, and the output field-effect transistor sources connected to supply voltage via forward-wired diodes as well as constant-current sources.

4. The apparatus according to claim 3, wherein the field-effect transistors are coupled to two compensating field-effect transistors, a first compensating field-effect transistor connected with its drain to the drain of a first said field-effect transistor and with its gate to a gate of the second said field-effect transistor, the second compensating field-effect transistor connected with its drain to the drain of the second said field-effect transistor and with its gate to the gate of the first said field-effect transistor.

5. The apparatus according to claim 4, wherein a capacitor interconnects the drains of the first said field-effect transistor and the first said compensating field-effect transistor and the drains of the second said field-effect transistor and the second said compensating field effect transistor.

6. The apparatus according to claim 2, wherein the configuration of the resonance amplifiers is such that the output signal of the last resonance amplifier in the direction of signal travel is delayed as compared to the signal present on the first input of the frequency mixer by at least one-fourth of the clock period of the alternating-voltage-carrying input signal.

7. The apparatus according to claim 3, wherein the configuration of the resonance amplifiers is such that the output signal of the last resonance amplifier in the direction of signal travel is delayed as compared to the signal present on the first input of the frequency mixer by at least one-fourth of the clock period of the alternating-voltage-carrying input signal.

8. The apparatus according to claim 4, wherein the configuration of the resonance amplifiers is such that the output signal of the last resonance amplifier in the direction of signal travel is delayed as compared to the signal present on the first input of the frequency mixer by at least one-fourth of the clock period of the alternating-voltage-carrying input signal.

9. The apparatus according to claim 5, wherein the configuration of the resonance amplifiers is such that the output signal of the last resonance amplifier in the direction of signal travel is delayed as compared to the signal present on the first input of the frequency mixer by at least one-fourth of the clock period of the alternating-voltage-carrying input signal.

10. The apparatus according to claim 1, wherein the configuration of the resonance amplifiers is such that the output signal of the last resonance amplifier in the direction of signal travel is delayed as compared to the signal present on the first input of the frequency mixer by at least one-fourth of the clock period of the alternating-voltage-carrying input signal.

11. The apparatus according to claim 10, including two delay lines interconnecting said frequency mixer and last resonance amplifier for delaying the output signal of the last resonance amplifier.

12. The apparatus according to claim 1, wherein each said resonance amplifier includes one differential amplifier with two field-effect transistors whose drains connect via an inductance configured as a coil and which are connected by a diode to a circuit line means: whose gates are connected to inputs of the resonance amplifier and whose sources are connected to a negative supply voltage via a constant-current source.

13. The apparatus according to claim 1, wherein the configuration of the resonance amplifiers is such that the output signal of the last resonance amplifier in the direction of signal travel is delayed as compared to the signal present on the first input of the frequency mixer by at least one-fourth of the clock period of the alternating-voltage-carrying input signal.

* * * * *

UNITED STATES PATENT AND TRADEMARK OFFICE
CERTIFICATE OF CORRECTION

PATENT NO.  : 5,703,912

DATED       : December 30, 1997

INVENTOR(S) : Zhigong Wang, et al.

It is certified that error appears in the above-identified patent and that said Letters Patent is hereby corrected as shown below:

Claim 3, Col. 9, Line 60, delete "timing" and insert --tuning--.

Signed and Sealed this

Seventeenth Day of March, 1998

*Attest:*

BRUCE LEHMAN

*Attesting Officer*                    Commissioner of Patents and Trademarks